United States Patent [19]
Yokota et al.

[11] Patent Number: 6,080,378
[45] Date of Patent: Jun. 27, 2000

[54] DIAMOND FILMS AND METHODS FOR MANUFACTURING DIAMOND FILMS

[75] Inventors: Yoshihiro Yokota; Takeshi Tachibana; Koichi Miyata; Koji Kobashi, all of Kobe, Japan

[73] Assignee: Kabushiki Kaisha Kobe Seiko Sho, Kobe, Japan

[21] Appl. No.: 08/924,701

[22] Filed: Sep. 5, 1997

[30] Foreign Application Priority Data

Sep. 5, 1996 [JP] Japan .................................. 8-257590

[51] Int. Cl.$^7$ .................................................. C30B 29/04
[52] U.S. Cl. ............................ 423/446; 117/86; 117/104; 117/929; 427/577
[58] Field of Search .............................. 117/86, 104, 929; 423/446; 427/577

[56] References Cited

U.S. PATENT DOCUMENTS

| | | | |
|---|---|---|---|
| 5,510,157 | 4/1996 | Chen et al. | 117/86 |
| 5,628,824 | 5/1997 | Vohra et al. | 117/101 |
| 5,635,258 | 6/1997 | Chen et al. | 427/577 |
| 5,755,879 | 5/1998 | Shintani et al. | 117/101 |
| 5,814,149 | 9/1998 | Shintani et al. | 117/104 |
| 5,883,389 | 3/1999 | Spear et al. | 250/461.1 |

OTHER PUBLICATIONS

Yacobi et al., "Cathodoluminscence study of diamond films grown by microwave plasma assisted chemical vapor deposition", journal of Appled Physics vol. 69(3) pp. 1643–1647, Jan. 2, 1991.
*The Properties of Diamond*, J.E. Field, ed., "Cathodoluminescence", G. Davies, pp. 165–181 (Academic Press, 1979).
*The Properties of Natural and Synthetic Diamond*, J.E. Field, ed., "Absorption and Luminescence Spectroscopy", C.D. Clark, et al., pp. 59–79 (Academic Press, 1992).

*Primary Examiner*—Robert Kunemund
*Attorney, Agent, or Firm*—Oblon, Spivak, McClelland, Maier & Neustadt, P.C.

[57] ABSTRACT

Diamond films and novel method to grow the diamond films can improve the performance of products utilizing diamond films. In the cathodoluminescence taken at room temperature, the integrated intensity ratio of the diamond films, $CL_1/CL_2$, is equal or greater than 1/20, where $CL_1$ is the integrated intensity of the emission band in the wavelength region shorter than 300 nm while $CL_2$ is the integrated intensity of the emission band in the wavelength region from 300 nm to 800 nm. Such high quality diamond films with intensive coalescence on the surface can be obtained by deposition on the substrates or films, made of at least one member selected from the group consisting of platinum, platinum alloys, iridium, iridium alloys, nickel, nickel alloys, silicon, and metal silicides.

22 Claims, 4 Drawing Sheets

DIAMOND FILMS AND METHODS FOR MANUFACTURING DIAMOND FILMS

BACKGROUND OF THE INVENTION

1. Field of the Invention

The present invention relates to a novel method of manufacturing diamond films, which can be used for electronic devices and sensors, such as transistors and diodes, heat sinks, surface acoustic wave devices, X-ray windows, optical materials, antiwear materials, decorating materials, and coating all of the above.

2. Discussion of the Background

Diamond is known to have excellent resistance in high temperature environments. It has a large band gap (5.5 eV), and hence is a good electrical insulator in its undoped state. However, it can be made semiconducting by doping with suitable impurity atoms. Furthermore, diamond has excellent electrical properties, such as a high breakdown voltage, high saturation velocities of carriers (electrons and holes), and a low dielectric constant. These characteristics make diamond very suitable for applications in electronic sensors and devices operational at high temperature, high frequency, high electric field, and high power.

Diamond is also expected to be used for various applications, e.g., optical sensors and light emission devices in the short wavelength region, based on the large band gap of diamond; heat sinks based on its high thermal conductivity and small specific heat; surface acoustic wave devices based on its extreme hardness (diamond is the hardest material known); and X-ray windows and optical materials, based on its high transmission and refractive index over a wide range of wavelength from infrared to ultraviolet. Moreover, diamond is used as antiwear parts of many kinds of cutting tools.

In order to fully utilize the excellent characteristics of diamond for these applications, it is important to synthesize high quality diamond films in which structural defects are minimized. As is very well known, bulk diamond crystals are presently produced either by mining natural diamond or by artificially synthesizing bulk crystals under high pressure-high temperature conditions. However, the area of the crystal facets for these diamonds are only about 1 cm$^2$ at best, and such diamonds are extremely expensive. Therefore, industrial applications of diamond today are limited only to specific fields, such as abrasive powders and high precision cutting tool tips, where small size diamonds are sufficient.

Recently, techniques to deposit diamond films on proper substrates by chemical vapor deposition have been reported. Regarding CVD of diamond films, the following techniques are known: microwave plasma CVD (for example, see Japanese patents (kokoku) Nos. Sho 59-27754 and Sho 61-3320), radio-frequency plasma CVD, hot filament CVD, direct-current plasma CVD, plasma-jet CVD, combustion CVD, and thermal CVD. By these techniques, it is possible to form continuous diamond films over a large area at low cost.

Cathodoluminescence (CL) is known as one of the methods to characterize crystal defects in diamond films. CL is a spectroscopic method to analyze emissions induced by irradiation with a high energy electron beam to samples. Therefore, by CL, emissions of inter-band transitions and emissions attributed to crystal defects and impurities can be detected. Cathodoluminescence is described in detail in *The Properties of Diamond*, J. E. Field, ed., "Cathodoluminescence", G. Davies, pp. 165–181 (Academic Press, 1979); and *The Properties of Natural and Synthetic Diamond*, J. E. Field, ed., "Absorption and Luminescence Spectroscopy", C. D. Clark, et al., pp. 59–79 (Academic press, 1992)

FIG. 5 shows the emission spectrum of a conventional CVD diamond film, with cathodoluminiscence intensity (arbitrary unit) on the vertical axis and wavelength horizontally. In conventional CVD diamond films, diamond crystals are oriented in a random fashion and there are many crystal axes on the surface of the diamond film. It is well known that conventional diamond films have a band A emission, which is assigned to crystal defects, in the wavelength region from 350 nm to 700 nm, as shown in FIG. 6 (P. J. Dean, Phys. Rev. Vol. A139, p. 588 (1965)). In this wavelength region from 350 nm to 700 nm, sometimes emission bands are also observed due to impurities, such as nitrogen, which are included in the diamond (J. Walker, Rep. Prog. Phys. Vol. 42, p. 1605 (1979)). It is also well known that band A emission is observed in boron-doped p-type semiconducting diamond films (H. Kawarada, et. al. Vacuum, Vol. 41, p. 885 (1990)).

In cathodoluminescence of a diamond film which possesses perfect crystalline quality and is free of defects, the only emission band observed is at 5.5 eV (225 nm), which is equivalent to the width of the forbidden band of diamond. This is a so-called band edge emission. Band edge emissions are considered to be due to the recombination of electron-hole pairs (excitons), which are generated by irradiation with an electron beam. Band edge emissions were reported to be observed only at low temperatures (liquid nitrogen or liquid helium temperatures) (H. Kawarada et. al., Proceedings of the 2nd International Symposium on Diamond Materials, Electrochemical Society, Penington, N.J., Vol. 91-8, p. 420 (1991)).

There are few reports about detection of band edge emissions at room temperature in conventional diamond films. Essentially, this is because conventional diamond crystals contain a high density of crystal defects and impurities which generate energy levels in the band gap. Given such mid-gap energy levels, the excitons mentioned above have a high probability of recombining through the defect or impurity levels, which are located below the conduction band. Therefore, the emission energy due to the recombination of the excitons is usually much smaller than the band gap energy, which corresponds to the wavelength of 225 nm.

When the energy relaxation process goes through a nonradiative transition, the electron energy is converted to lattice vibrations (phonons) and finally released as heat. The probability of energy conversion to phonons increases with temperature. Therefore, at room temperature, the band edge emissions can not occur or are too weak to be detected.

If a perfect diamond crystal, free of the defect and impurity levels, ever exists, there should be no radiationless transition through such mid-gap levels. It is also expected that the intensity of the band edge emission would not be reduced, even at room temperature. However, it has been difficult to confirm this expectation, because perfect diamond crystals have not been obtained by any conventional methods. Moreover, efforts have not been made to produce such high quality diamond. Thus, the CL measurement at room temperature has not been used as a standard method to analyze the quality of diamond films. It has not been considered that the CL measurement is a suitable technique to determine the quality of diamond films in the process of improving the quality of diamond-based industrial products.

The present invention is proposed in order to solve these problems. It is an object of the present invention to provide high quality diamond films and novel methods for manufacturing such high quality diamond films.

SUMMARY OF THE INVENTION

The diamond films of the present invention are characterized by the fact that the intensity ratio of cathodoluminescence measured at room temperature, $CL_1/CL_2$, is equal or greater than 1/20, where $CL_1$ is the integrated intensity of the emission band in the wavelength region shorter than 300 nm and $CL_2$ is the integrated intensity of the emission band in the wavelength region of from 300 nm to 800 nm.

It is preferable that the diamond film has (111) or (100) crystal face at the surface and the adjacent crystals are coalesced at the surface.

Diamond films of the present invention may be made by chemical vapor deposition, where the diamond film produced has an intensity ratio of cathodoluminescence measured at room temperature, $CL_1/CL_2$, of equal to more than 1/20. Here, $CL_1$ is the integrated intensity of the emission band in the wavelength region shorter than 300 nm and $CL_2$ is the integrated intensity of the emission band in the wavelength region of from 300 nm to 800 nm.

The diamond films are preferably deposited on substrates or films comprising a member selected from the group consisting of Pt, Pt alloys, Ir, Ir alloys, Ni, Ni alloys, Si and metal silicides.

It is also preferable that diamond films are deposited by CVD on substrates or films, with surfaces which are inclined within ±10 degrees from the (111) crystal face. It is also preferred that adjacent (111) diamond faces are coalesced to form a single network at the surface. Moreover, it is preferred that diamond films are deposited by CVD on substrates or films, which are inclined within ±10 degrees from the (100) crystal face. It is also preferred that adjacent (100) diamond faces are coalesced to form a single network at the surface.

Furthermore, it is preferred that the gas, which is used to deposit diamond films by CVD, at least contains carbon and boron. It is also preferred that the atomic concentration ratio, [B]/[C], is equal to or more than 2000 ppm (0.002), where [C] is the atomic concentration in the gas phase, and [B] is the atomic concentration in the gas phase. It is also preferred to apply a bias voltage between the plasma and the substrates or films to nucleate diamonds.

The integrated intensity of the present invention is the area of each band, which is obtained by removing the background of observed emission bands and resolving them into Gaussian- or Lorentzian-bands according to the method of spectrum analysis.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE INVENTION

Figure 1:
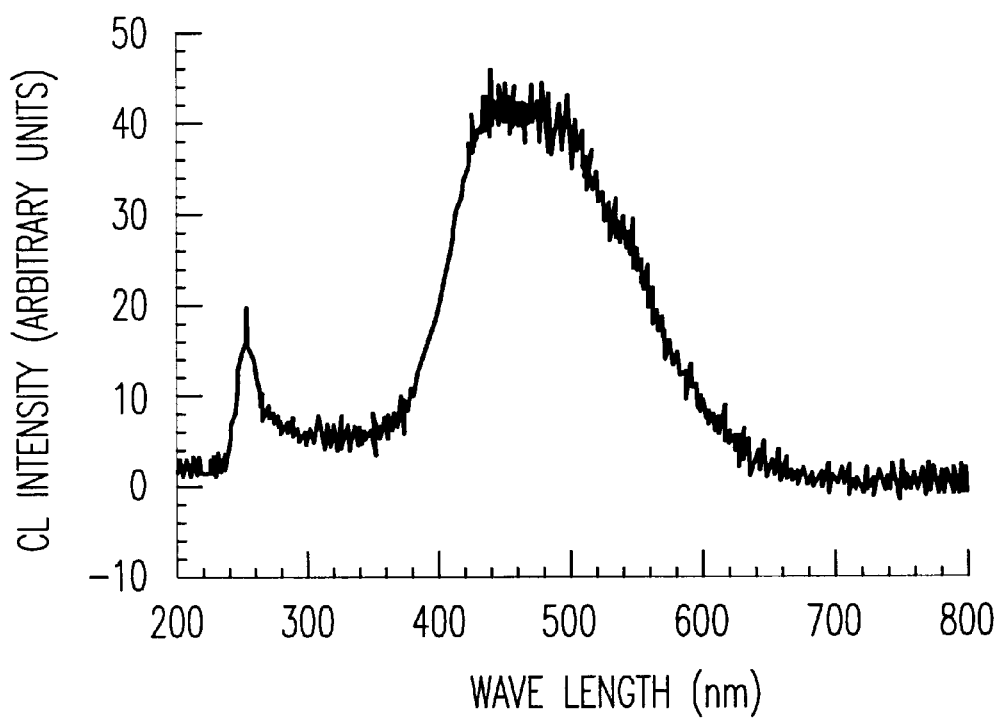
FIG. 1 shows a cathodoluminescence spectrum of a diamond film grown for 6 hours, where the vertical axis indicates the emission intensity and the horizontal axis indicates wavelength of emitted light.

As mentioned before, generally, when cathodoluminescence of a diamond film is measured at room temperature, the emission band, called band A or strong emission bands attributed to various lattice defects and impurities, are observed in the wavelength region of from 300 nm to 800 nm, which is longer than the wavelength of the band edge emission. This means that there always exist crystal defects or impurities in conventional diamond films in a density high enough that they can be detected by cathodoluminescence. Excitons, generated by the electron beam irradiation and excited to the conduction band, recombine with holes at mid-gap levels caused by these defects and impurities, including radiationless transitions. Therefore, in conventional diamond films, the band edge emission (exciton emission) is very weak or too weak to be observed at room temperature.

In the cathodoluminescence spectra of the diamond films grown by CVD in the present invention, there is only one emission band in the wavelength region shorter than 300 nm or there are two emission bands in the wavelength region shorter than 300 nm, as well as in the wavelength region from 300 nm to 800 nm. The emission band in the wavelength region shorter than 300 nm is observed because of the very low density of crystal defects in the film. The emission band in the wavelength region shorter than 300 nm can be observed even if the diamond films contain grain boundaries, as long as the diamond is coalesced to form a single network on the surface.

It is most preferred that emission bands, except band edge emission in the wavelength region shorter than 300 nm, are not observed in the cathodoluminescence spectra of diamond films grown by CVD using the method of the present invention. However, cathodoluminescence at room temperature is so sensitive to the crystal defects and impurities that the emission band in the wavelength region from 300 nm to 800 nm is observed even if these defects and impurities are present in the diamond films at a very low density.

It was found by the present inventors that the performance of products based on the diamond films is not affected even if the diamond films have an emission band, in addition to the band edge emission in their cathodeluminescence spectra, unless $CL_1/CL_2$ is less than 1/20. If the intensity ratio, $CL_1/CL_2$, is less than 1/20, it means that the diamond film contain a significant density of defects and impurities. The quality of the diamond is so poor that the performance of products using this diamond film is not good. The integrated intensity ratio between the emission band in the wavelength region shorter than 300 nm and that from 300 nm to 800 nm, $CL_1/CL_2$, must be equal or greater than 1/20 in the present invention.

The integrated intensity of the present invention means the area of each bands, which are obtained by subtracting the background observed for the emission bands and resolving the bands into Gaussian- or Lorentzian-bands according to the method of spectrum analysis.

According to another aspect of the present invention, even though boron is generally considered an impurities for diamond, there are some boron-doped semiconducting diamond films which do not have any other emission bands except the band edge emission in cathodoluminescence spectra. This means that the boron is not inhibiting the band edge emission in the wavelength region shorter than 300 nm. Thus, boron must be distinguished from other impurities, which inhibit the band edge emission. In the present invention, impurities are defined as all non-carbon elements except boron. It is well known that boron induces acceptor an level above 0.37 eV from the valence band in diamond. Therefore, it is predicted that impurities, which induce comparatively shallow levels, of which the activation energy is smaller than 1.0 eV, in the band gap, should give effect similar to boron.

The present inventors have established a method to manufacture diamond films by CVD, which have an emission band only in the wavelength region shorter than 300 nm in cathodoluminescence spectra. By using the CVD method according to the present invention, high quality diamond film, whose defect density is lower than any existing, conventional diamond films, can be obtained.

The method to manufacture diamond films according to the present invention is described in more detail below. High quality diamond films, whose exciton emission is observed at room temperature, can be manufactured, for example, on single crystal Pt substrates by CVD. When the crystal axes of substrate surfaces are (111)- or (100)-single crystals, or are inclined within ±10 degree angles from (111) or (100) crystal face, the crystal axes of diamond films manufactured on these substrates become (111)- or (100)-oriented. In order to obtain the clear band edge emission, it is essential to have coalesced (111)- or (100)-crystal facets on the surface of the diamond films.

It is preferred to use bulk materials or films deposited on proper base materials of Pt, Pt alloys, Ir, Ir alloys, Ni, Ni alloys, Si and metal silicides, as the substrate materials for the deposition of high quality diamond films. In any of the substrates, as long as the crystal axis of the surface is defined as mentioned above, the diamond films with intensive coalescence on the surface can be obtained. If the substrate is a single crystal or almost a single crystal, manufacture of coalesced diamond films is facilitated.

In case where the diamond films are synthesized on a film deposited on the proper supporting material, the film can be deposited by well-known methods including sputtering and electron beam deposition. Basically, there is no restriction on the film thickness. However, if the films are too thin, they may peel off from the supporting material during CVD. On the other hand, a longer deposition time is required for depositing thick films. Therefore, it is preferred in the present invention to make the film thickness to be more than about 1000 Å and less than about 0.5 mm. Annealing in the proper atmosphere after deposition of the film can improve the crystal quality of the deposited film.

As the supporting materials, a single crystal of lithium fluoride, calcium fluoride, magnesium oxide, nickel oxide, zirconium oxide, sapphire (aluminum oxide), strontium titanate, barium titanate, lead titanate, potassium tantalate, and lithium niobate are preferred. In those cases, the films deposited on those supporting materials can be easily made in monocrystaline form.

In yet another aspect of the present invention, it is preferred to use a source gas including at least carbon and boron during part, or during the entire process of CVD growth of the diamond films. Boron included in the source gas is effective for decreasing the defect density, which induces defect levels in the diamond and makes the defects inactive. By heavily doping with boron, the hole concentration in the diamond becomes high and hence the probability of direct recombination of electrons and holes, of which exciton consist, is also increased. As a result, the probability of radiationless transitions of excitons is decreased and the band edge emission is enhanced.

In particular, in case where the atomic concentration ratio, [B]/[C], is greater than 2000 ppm, diamond films, whose CL spectra do not have any other emission bands except the band edge emission, can be obtained. Here, [C] means the atomic concentration of carbon and [B] means the atomic concentration of boron in the source gas.

In the present invention, diamond films can be grown on substrates or films, whose surfaces have been roughened by scratching using buff and/or ultrasonic polishing with diamond powder or diamond paste prior to diamond CVD. It is preferred to form diamond nuclei on the substrate surface by electrical biasing of the substrates or films in the plasma prior to growing the films. By using this method, the crystal orientation of diamond grains grown by CVD is enhanced and the extent of coalescence is also enhanced. Moreover, by optimizing conditions of electrical biasing of the substrates or films, monocrystalline diamond films can be grown.

In the present invention, it is also possible to grow diamond films in selected areas of the substrates. This is achieved by masking unnecessary areas with silicon nitride or silicon oxide films prior to diamond CVD.

The diamond films grown by CVD using the method of present invention, are higher quality than any existing, conventional diamond films. Therefore, very high performance devices can be produced using these diamond films to form Schottky barrier diodes, metal/intrinsic semiconductor/semiconductor (MiS) contact type rectification diodes and light emitting diodes which emit light in the visible or ultraviolet region. Moreover, such diamond films can provide higher performance products than any existing, conventional diamond-based products including heat sinks, surface acoustic wave devices, various sensors, optical windows, and antiwear materials that require a reduced defect density.

In those products based on diamond films, it is most preferred that all parts, where diamond films are used, are made of diamond films of high quality. It is also acceptable, however, to have high quality diamond films at least for the main parts of the diamond-based products.

EXAMPLES

Various other objects, features and attendant advantages of the present invention will be more fully appreciated as the same becomes better understood from the following detailed description when considered in connection with the accompanying drawings in which like reference characters designate like or corresponding parts throughout the several views and wherein:

Example 1

By using a NIRIM (National Institute for Research in Inorganic Materials, Tsukuba, Japan)-type microwave plasma CVD apparatus (described in Example 1 and FIG. 8 of U.S. application Ser. No. 08/560,077, the entire contents of which are hereby incorporated by reference), a diamond film was grown on a single crystal Pt (111) substrate (diameter: 10 mm; thickness: 2 mm; and purity: 99.99%). A mixture of methane/diborane/hydrogen gas with a methane concentration of 0.3% was used. In this example, the atomic concentration ratio, [B]/[C], was 3333 ppm, where [B] means atomic concentration of boron and [C] means the atomic concentration of carbon in the source gas. The substrate temperature was kept at 800–890° C. by adjusting the microwave power and the substrate position.

After a 6 hour deposition, oriented diamond particles were grown on the substrate. FIG. 1 shows an emission spectrum of the diamond film grown for 6 hours with cathodoluminescence intensity on the vertical axis versus wavelength of light on the horizontal axis. As shown in FIG. 1, the band A emission in the wavelength region around 500 nm and band edge emission around 250 nm were observed. In FIG. 1, the integrated intensity ratio between emission bands, $CL_1/CL_2$, was 1/18.

Figure 2:
FIG. 2 shows the surface morphology of a diamond film grown for 50 hours according to the method of Example #1.
Figure 3:
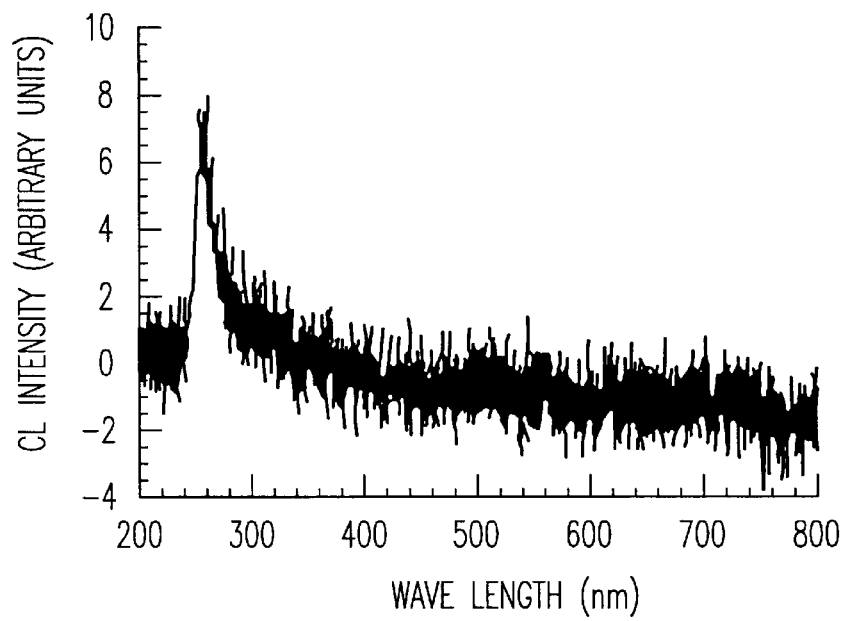
FIG. 3 shows a cathodoluminescence spectrum of the diamond film illustrated in FIG. 2, where the vertical axis indicates the emission intensity and the horizontal axis indicates wavelength of emitted light.

The CVD growth of the diamond film was continued under the same conditions for more than 50 hours. FIG. 2 shows the surface morphology of the CVD diamond film grown for 50 hours by the method of the present example. FIG. 3 shows a cathodoluminescence spectrum of the diamond film shown in FIG. 2. As shown in FIG. 2, after 50 hours, adjacent (111) crystal faces coalesced at the surface of the diamond film. As shown in FIG. 3, the cathodoluminescence spectrum of the diamond film at room temperature showed the band edge emission in the wavelength region around 250 nm and band A was not observed. This means that the diamond film obtained is of a very high quality.

Example 2

Diamond films were synthesized by microwave plasma CVD using the NIRIM type apparatus under the conditions described below. The substrates used were single crystals of Pt (purity 99.99%; diameter: 10 mm; and thickness: 2 mm) with (111) crystal surfaces. In the reaction chamber, the substrate holder made of molybdenum and a counter electrode were set. Prior to deposition, plasma treatment of the substrate and then biasing of the substrate were carried out. The conditions for plasma treatment of the substrate, biasing, and deposition are described bellow.

[Plasma treatment prior to biasing]
Source gas: 0.1 to 70% $CH_4$ diluted by $H_2$
Gas flow rate: 50 to 300 sccm
Substrate temperature: 600 to 1100° C.
Gas pressure: 10 to 50 Torr
Plasma treating time: 10 to 120 minutes.
[Diamond nucleation by biasing]
Source gas: 1 to 70% $CH_4$ diluted by $H_2$
Doping gas: diborane ($B_2H_6$), ([B]/[C]=0, 400, 1000, 2100, 3300 ppm)
Gas flow rate: 50 to 300 sccm
Substrate temperature: 400 to 1100° C.
Gas pressure: 1 to 100 Torr.
Applied electric bias: −70 to −350 Vdc or +70 to +350 Vdc
Biasing time: 1 to 90 minutes.
[Diamond growth after biasing]
Source gas: 0.1 to 10% $CH_4$ and 0.1 to 7% $O_2$ diluted by $H_2$
Doping gas: diborane ($B_2H_6$), ([B]/[C]=0, 400, 1000, 2100, 3300 ppm)
Gas flow rate: 50 to 300 sccm
Substrate temperature: 700 to 950° C.
Gas pressure: 20 to 100 Torr.

After a 50 hour deposition of the diamond film, in case where [B]/[C] was less than 2000 ppm (that is, [B]/[C] was equal to 0, 400, 1 000 ppm), oriented diamond particles were deposited and the CL spectra were similar to FIG. 1. In case where [B]/[C] was equal or more than 2000 ppm (that is, [B]/[C] was equal to 2100, 3300 ppm), (111) crystal faces of the diamond particles coalesced at the surface as shown in FIG. 2. The CL spectra of these diamond films had only the band edge emission in the wavelength region around 250 nm as shown in FIG. 3. However, when the biasing conditions were not in the above ranges, the CL spectra of grown diamond films were similar to that shown in FIG. 1.

Example 3

Figure 4:
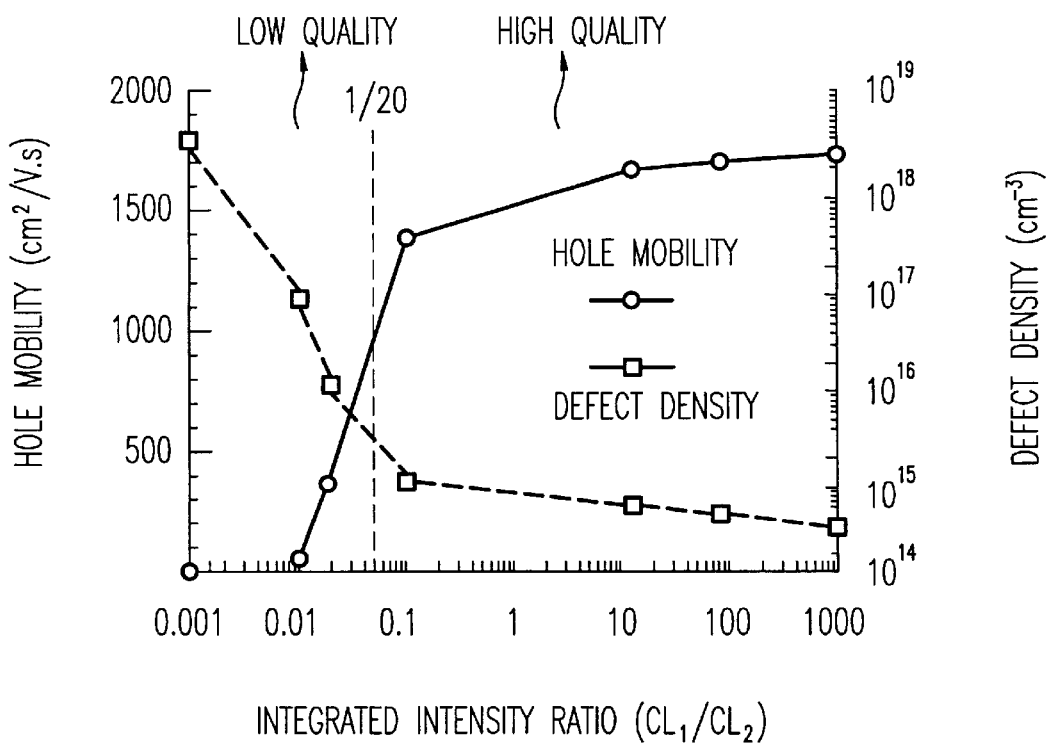
FIG. 4 shows Hall mobility and defect density of various diamond films versus $CL_1/CL_2$.
Figure 5:
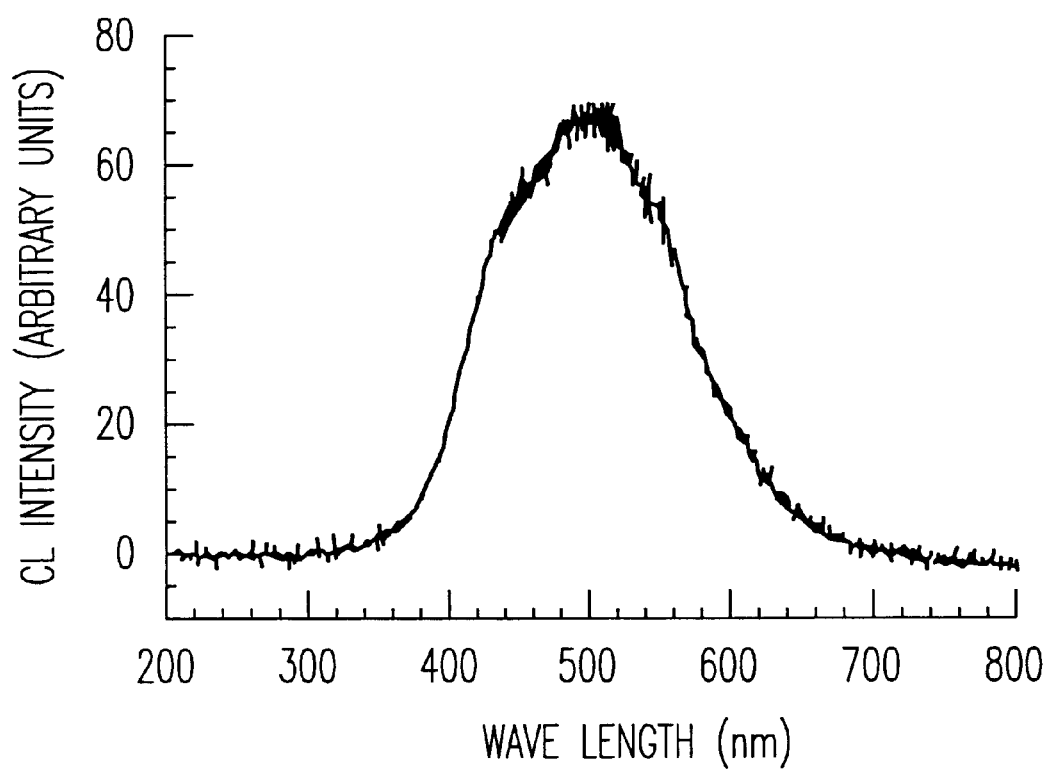
FIG. 5 shows a cathodoluminescence spectrum of a conventional diamond film, where the vertical axis indicates the emission intensity and the horizontal axis indicates wavelength of emitted light.

Hall mobility, defect density, and cathodoluminescence at room temperature were measured for diamond films grown for various duration by the method shown in Example 1. FIG. 4 shows the Hall mobility and defect density of the various diamond films versus the integrated intensity ratio between emission bands ($CL_1/CL_2$) horizontally.

As shown in FIG. 4, as the integrated intensity ratio between emission bands increases, the Hall mobility increases while the defect density decreases. The Hall mobility is an important factors for electronic device applications. Diamond with high Hall mobility can provide high performance for electronic devices. Namely, as the integrated intensity ratio between the emission bands increases, the quality of diamond becomes high. In particular, utilizing diamond films whose integrated intensity ratio between emission bands ($CL_1/CL_2$) is equal or more than 1/20, for electric devices, can improve the performance of the products using diamond films.

Example 4

A single crystal platinum thin film 8 μm thick was deposited by sputtering on a single crystal strontium titanate ($SrTiO_3$) substrate on a (111) crystal surface. On the Pt-deposited strontium titanate substrate, a p-type semiconducting diamond film was grown by CVD using NIRIM-type microwave CVD apparatus. A mixture of methane/diborane/hydrogen gas was used as the source gas with a methane concentration of 0.3%. In the present example, the atomic concentration ratio, [B]/[C], was 400 ppm. Here, [B] is atomic concentration of boron and [C] is atomic concentration of carbon in the source gas. The substrate temperature was kept at 800–890° C. by adjusting the microwave power and the substrate position. The growth time was 20 hours. The integrated intensity ratio ($CL_1/CL_2$) between the emission bands of the diamond film obtained was 1/5.

Subsequently, on the deposited diamond film 5 μm thick, Au thin film electrodes were formed by photolithography and Schottky barrier diodes were formed. The current-voltage (I-V) characteristics were measured between the platinum film, which was used as the substrate of the diamond film, and the gold electrode on the diamond surface. The forward current/reverse current (rectification ratio) was $10^6$. Current-voltage (I-V) characteristics of a conventional diamond film were also measured in the same manner. The rectification ratio was $10^4$. It was confirmed that the diamond film grown by the present invention can improve the performance of Schottky barrier diodes.

Example 5

A p-type semiconducting diamond film 5 μm thick was grown by CVD in the same manner as in Example 4. An undoped diamond layer 0.1 μm thick was subsequently deposited on the semiconducting diamond film. Next, Au thin film electrodes were formed by photolithography on the surface of the undoped diamond film and metal/intrinsic semiconductor/semiconductor (MiS) junction rectification diodes were formed. The current-voltage (I-V) characteristics were measured between the platinum film used as the substrate of the diamond and the gold electrode on the surface of the undoped diamond film. The forward current/reverse current (rectification ratio) was $10^{10}$. On the other hand, by using a conventional diamond film, the current-voltage (I-V) characteristics were measured in the same manner and the rectification ratio was $10^6$. It was confirmed that the diamond films formed by the method of the present invention can improve the performance of MiS junction type rectifying diodes.

Example 6

On the diodes formed in Examples 4 and 5, aluminum electrodes, instead of the gold electrodes, were formed and emissions from the diodes were measured in forward bias. Cathodoluminescence spectra similar to those from the boron-doped diamond films were observed. Namely, the band edge emission was observed in these emitting diodes.

As described above, the present invention improves the quality of diamond films by analyzing and specifying the cathodoluminescence spectra of the diamond films at room temperature. By the present invention, high quality diamond films that show predicted CL spectra, can be obtained by defining conditions including the substrate, pretreatment prior to CVD growth, and/or the source gas for deposition. Therefore, the performance of devices using diamond films can be improved.

High quality diamond films are formed by the present invention. Utilizing the diamond films in various applications, where use of diamond has been practically limited, is now possible. The present invention can contribute to the developments in many fields.

Obviously, numerous modifications and variations of the present invention are possible in light of the above teachings. It is therefore to be understood that within the scope of the appended claims, the invention may be practiced otherwise than as specifically described herein.

The priority document of the present application, Japanese patent application no. Hei 08-257590, field on Sep. 5, 1996, is hereby incorporated by reference.

What is claimed is:

1. A diamond film, wherein a cathodoluminescence spectrum obtained at room temperature of said diamond film has an integrated intensity ratio between emission bands $CL_1/CL_2$ equal to or greater than 1/20, where $CL_1$ is an integrated intensity of an emission band in a wavelength region shorter than 300 nm and $CL_2$ is an integrated intensity of an emission band in a wavelength region from 300 nm to 800 nm.

2. The diamond film of claim 1, wherein (111) or (100) crystal faces of grains of said diamond film are coalesced on a surface of said diamond film.

3. A method for forming a diamond film, the method comprising:
depositing a diamond film on a surface of a substrate by chemical vapor deposition, and
forming the diamond film of claim 1.

4. The method of claim 3, wherein said surface of said substrate comprises at least one member selected from the group consisting of platinum, platinum alloys, iridium, iridium alloys, nickel, nickel alloys, silicon and metal silicides.

5. The method of claim 4, wherein said surface of said substrate has a crystal face within 10 degrees of a (111) crystal face.

6. The method of claim 4, wherein said surface of said substrate has a (111) single crystal face.

7. The method of claim 5, wherein (111) crystal faces of grains of said diamond film coalesce at a surface of said diamond film during said depositing.

8. The method of claim 6, wherein (111) crystal faces of grains of said diamond film coalesce at a surface of said diamond film during said depositing.

9. The method of claim 4, wherein said surface of said [substrates] substrate has a crystal face within 10 degrees of a (100) crystal face.

10. The method of claim 4, wherein said surface of said substrate has a (100) single crystal face.

11. The method of claim 9, wherein (100) crystal faces of grains of said diamond film coalesce at a surface of said diamond film during said depositing.

12. The method of claim 10, wherein (100) crystal faces of grains of said diamond film coalesce at a surface of said diamond film during said depositing.

13. The method of claim 3, wherein a source gas for said chemical vapor deposition comprises carbon and boron in an atomic concentration ratio, [B]/[C], equal to or greater than 2000 ppm.

14. The method of claim 4, further comprising, prior to said depositing, biasing said surface of said substrate in a plasma to form diamond nuclei.

15. The method of claim 13, wherein said carbon is present as methane and said boron is present as diborane.

16. A method for forming a diamond film, the method comprising:
depositing a diamond film on a surface of a substrate by chemical vapor deposition with a source gas; and
forming the diamond film of claim 1, wherein
said surface of said substrate comprises at least one member selected from the group consisting of platinum, platinum alloys, iridium, iridium alloys, nickel, nickel alloys, silicon and metal silicides;
said surface of said substrate has a crystal face within 10 degrees of a (111) or (100) crystal face; and
said source gas comprises carbon and boron.

17. The method of claim 16, wherein (111) or (100) crystal faces of grains of said diamond film coalesce at a surface of said diamond film during said depositing.

18. The method of claim 16, wherein said source gas for said chemical vapor deposition comprises carbon and boron in an atomic concentration ratio, [B]/[C], equal to or greater than 2000 ppm.

19. The method of claim 16, further comprising, prior to said depositing, biasing said surface of said substrate in a plasma to form diamond nuclei.

20. A diamond film produced by the method of claim 16.

21. The diamond film of claim 1, the diamond film comprising boron.

22. A diamond film, wherein a cathodoluminescence spectrum obtained at room temperature of said diamond film has an emission band only in a wavelength region shorter than 300 nm.

* * * * *